United States Patent [19]

Blackburn et al.

[11] Patent Number: 5,693,179
[45] Date of Patent: Dec. 2, 1997

[54] CONTAMINANT REDUCTION IMPROVEMENTS FOR PLASMA ETCH CHAMBERS

[75] Inventors: Greg Blackburn; Joseph Kava; Richard McGovern; Yan Rozenzon, all of San Jose, Calif.

[73] Assignee: Applied Materials, Inc., Santa Clara, Calif.

[21] Appl. No.: 459,172

[22] Filed: Jun. 2, 1995

Related U.S. Application Data

[62] Division of Ser. No. 439,144, May 11, 1995, which is a continuation of Ser. No. 145,260, Oct. 29, 1993, abandoned.

[51] Int. Cl.[6] .................. H01L 21/306; C23C 14/34; H05H 1/24
[52] U.S. Cl. .................. 156/643.1; 216/59; 216/63; 216/67; 216/71; 204/192.32; 204/192.33; 427/569
[58] Field of Search ................ 216/59, 63, 66, 216/67, 68, 69, 70, 71; 156/643.1; 204/192.1, 192.32, 192.33, 192.36; 427/569

[56] References Cited

U.S. PATENT DOCUMENTS

| | | | |
|---|---|---|---|
| 3,608,519 | 9/1971 | Richardson et al. | 118/730 |
| 4,245,154 | 1/1981 | Uehara et al. | 250/227 |
| 4,252,595 | 2/1981 | Yamamoto | 156/345 |
| 4,282,077 | 8/1981 | Reavill | 204/192.32 |
| 4,298,443 | 11/1981 | Maydan | 204/298.31 |
| 4,345,968 | 8/1982 | Coe | 204/298.32 |
| 4,358,686 | 11/1982 | Kinoshita | 204/192.32 |
| 4,512,283 | 4/1985 | Bonifield et al. | 118/723 |
| 4,563,367 | 1/1986 | Sherman | 156/643.1 |
| 4,612,432 | 9/1986 | Sharp-Giesler | 219/121 |
| 4,632,719 | 12/1986 | Chow et al. | 204/298.33 |
| 4,786,352 | 11/1988 | Benzing | 156/643.1 |
| 4,842,683 | 6/1989 | Cheng et al. | 156/345 |
| 4,960,610 | 10/1990 | Krogh | 118/723 E |
| 5,049,251 | 9/1991 | Inoue | 204/192.12 |
| 5,221,425 | 6/1993 | Blanchard et al. | 216/67 |
| 5,458,725 | 10/1995 | Granger et al. | 118/715 |

FOREIGN PATENT DOCUMENTS

| | | | |
|---|---|---|---|
| 0425 419 | 5/1991 | European Pat. Off. | C23C 16/50 |
| 0574 859 | 12/1993 | European Pat. Off. | H01J 37/32 |
| 62 241336 | 10/1987 | Japan | H01L 21/302 |
| 62-241336 | 10/1987 | Japan | 156/345 R |
| 64-18224 | 1/1989 | Japan | 156/345 |
| 1 140725 | 6/1989 | Japan | H01L 21/302 |
| 1-140725 | 6/1989 | Japan . | |

OTHER PUBLICATIONS

Francis, Terry "Controlling process equipment contamination in the '90's," Semiconductor International, Oct. 1993 62:62–66.

T. Yasuo, "Dry Etching of Al–Si–Cu Alloy," vol. 13, No. 396, (E–815), 4 Sep. 1989 & JP–A–01 140 725 (Matsushita Electric Ind. Co. Ltd.) 1 Jun. 1989 abstract.

F. Yasuhiro, "Plasma Etching Device," vol. 12, No. 111, (E–598), 8 Apr. 1988 & JP–A–62 241 336 (NEC KYUSHU Ltd.) 22 Oct. 1987 abstract.

*Primary Examiner*—R. Bruce Breneman
*Assistant Examiner*—Rodney G. McDonald
*Attorney, Agent, or Firm*—Townsend and Townsend and Crew LLP

[57] ABSTRACT

A plasma etch chamber includes a modified focus ring which is used in conjunction with chamber pressure throttling to eject contaminants in the focus ring away from the substrate just before the etching cycle is completed. Additionally, process gas is directed against the inner wall of the chamber to create a swirling flow of plasma within the chamber and thus disturb any contaminant-generating field adjacent the chamber wall. A process gas, or a non-reactive purge gas, may also be supplied from a diffuser atop the cathode, to direct a gas layer along the top and sides of the chamber to reduce contaminant build-up on the chamber surfaces.

30 Claims, 6 Drawing Sheets

CONTAMINANT REDUCTION IMPROVEMENTS FOR PLASMA ETCH CHAMBERS

This is a divisional of Application Ser. No. 08/439,144, filed May 11, 1995, which is a continuation of Application No. 08/145,260, filed Oct. 29, 1993, now abandoned.

BACKGROUND OF THE INVENTION

The present invention relates to the field of microelectronic substrate processing. More particularly, the present invention relates to the processing of substrates in plasma environments, including sputter etching or reactive sputter etching.

One method of etching semiconductor substrates to create microelectronic circuits thereon uses a process gas which is energized into an etching plasma within a vacuum etch chamber. This method is described in detail in U.S. Pat. No. 4,298,443, Maydan, et. al., which is fully incorporated herein by reference. The plasma etch chamber disclosed therein includes a multi-sided upwardly extending cathode, which is enclosed within an outer housing which serves as an anode. A plurality of masked substrates are received on the cathode. To process the substrates, the chamber is maintained at a pressure of 5 to 200 milli-torr and a process gas is charged into the chamber and energized into an etching plasma by an RF power supply. After the etching of the substrates is completed, the RF power supply is de-energized or uncoupled, and the substrate is removed.

Process gas must be constantly introduced into the chamber to maintain the plasma. In one known plasma etch chamber, a plurality of vertical gas tubes extend upwardly from the chamber base adjacent each apex of the multi-sided cathode to supply the process gas into the chamber. A plurality of holes are located through the circumferential wall of the tubes at various heights from the chamber base, and the gas exiting therefrom is directed across the face of the substrates on the adjacent cathode faces, or across the cathode faces adjacent the substrates. Because the gas enters a very low pressure area having a voltage gradient therein, the gas instantaneously forms a plasma as it leaves the gas tubes. As soon as the voltage gradient is removed, the plasma will collapse back into the process gas.

The plasma formed from the process gas selectively etches exposed surfaces of the substrate by electron bombardment and chemical attack. The substrate is masked with a resist, and free electrons expelled from the plasma bombard the substrate to remove material from the surface of the substrate until the required etch depth is reached in the non-resist protected areas thereof. The bombarding electrons travel primarily normal to the lines of uniform electric potential in the plasma. Although the lines of equal electrical potential are generally parallel to the large flat surface of the substrate and cathode, the electric field bends about the edge of the substrate where the substrate is raised from the surface of the cathode. As a result of this bend in the electric field, the electrons travel at an oblique angle to the surface of the substrate at the substrate edge. These electrons obliquely engage the substrate at the base of the resist along the substrate edge and undercut the resist. To help minimize undercutting, a circular non-conductive focus ring may be placed about the edge of the substrate to absorb the electrons which are travelling obliquely with respect to the substrate. The focus ring also helps reduce discontinuities in the plasma layer above the substrate, by limiting the creation of flow eddies or other discontinuities in the plasma adjacent the substrate to reduce edge to center variation of the etch rate. However, the focus ring also encourages creation of a confined area of plasma above the substrate, and contaminants may become trapped therein and attach themselves to the substrate to create a substrate defect.

The plasma etch process is typically used to etch metal or dielectric layers on substrates. Metal etching uses chlorine based gases such as HCL and $BCL_3$ to form the plasma, whereas dielectric etching uses oxygen, and fluorocarbons such as $CHF_3$ or $CF_4$, as the plasma gas species. In either case, the material removed by the plasma from the substrate coating, alone or in combination with the recombination of the disassociated process gas which occurs at the very low processing pressure, may form a chamber contaminant commonly known as polymer. This contaminant is typically comprised of chain molecules of carbon compounds, and it occurs as a byproduct of the plasma etch process. When the polymer contacts and adheres to the substrate, it contaminates that portion of the substrate and reduces the die yield therefrom. Polymer also congregates on all chamber surfaces, but is amplified on the surfaces of the chamber housing adjacent the gas feed tubes, as well as the underside of the chamber cover adjacent the top of the multi-sided cathode. This polymer may migrate onto a substrate to create a substrate defect.

SUMMARY OF THE INVENTION

In accordance with the invention, a plasma-based processing chamber is provided with improved contaminant reduction apparatus and methods. In one embodiment, the processing pressure in the plasma-based processing chamber is modified, preferably only during the final moments of substrate processing, to cause contaminants in the area immediately adjacent the substrate to move away from the substrate before the electric field supporting the plasma is deenergized. In a preferred embodiment, the processing chamber is a plasma etch chamber, and a focus ring, which includes apertures therethrough for enhancing the movement of particulate contamination away from the substrate at the end of a plasma etch operation, is located about the periphery of the substrate. The apertures are positioned through the focus ring at the distance from the substrate at which the dark field is established. To flush the polymer or other contaminants out of the focus ring, and thus prevent attachment thereof to the substrate when the plasma collapses at the end of an etch cycle, the pressure or flow in the chamber is changed just before the plasma supporting electrical field is de-energized. As a result of the pressure change, the dark field, with the polymer or other contaminants therein, will be moving away from the substrate as the plasma collapses into the non-energized process gas. The apertures allow plasma, and the gas which reforms from the plasma as it collapses, to flow through the wall of the focus ring and thus supply a volume of fresh gas or plasma in the vicinity of the substrate surface as the dark field and particulates therein move out of the focus ring.

In addition to the use of apertures in the focus ring, the etch chamber may be modified by providing additional ports in the gas supply tubes which direct a portion of the chamber process gas obliquely against the inner wall of the chamber adjacent the gas tubes. All of the additional ports in the gas supply tubes are oriented similarly, to create a rotational flow of process gas or plasma about the inner perimeter of the chamber.

In an alternative embodiment of the invention, the multi-sided cathode may be provided with a diffuser head in the center of the top thereof. A supply of non-reactive gas flows therethrough, and then along the inside of the top and sides of the chamber. The diffuser gas flows out of the chamber through a throttled exhaust valve to help exhaust the polymer.

BRIEF DESCRIPTION OF THE DRAWINGS

These, and other objects and advantages of the invention will be apparent from the following description when read in conjunction with the accompanying drawings, wherein.

BRIEF DESCRIPTION OF THE EMBODIMENTS

Figure 1:
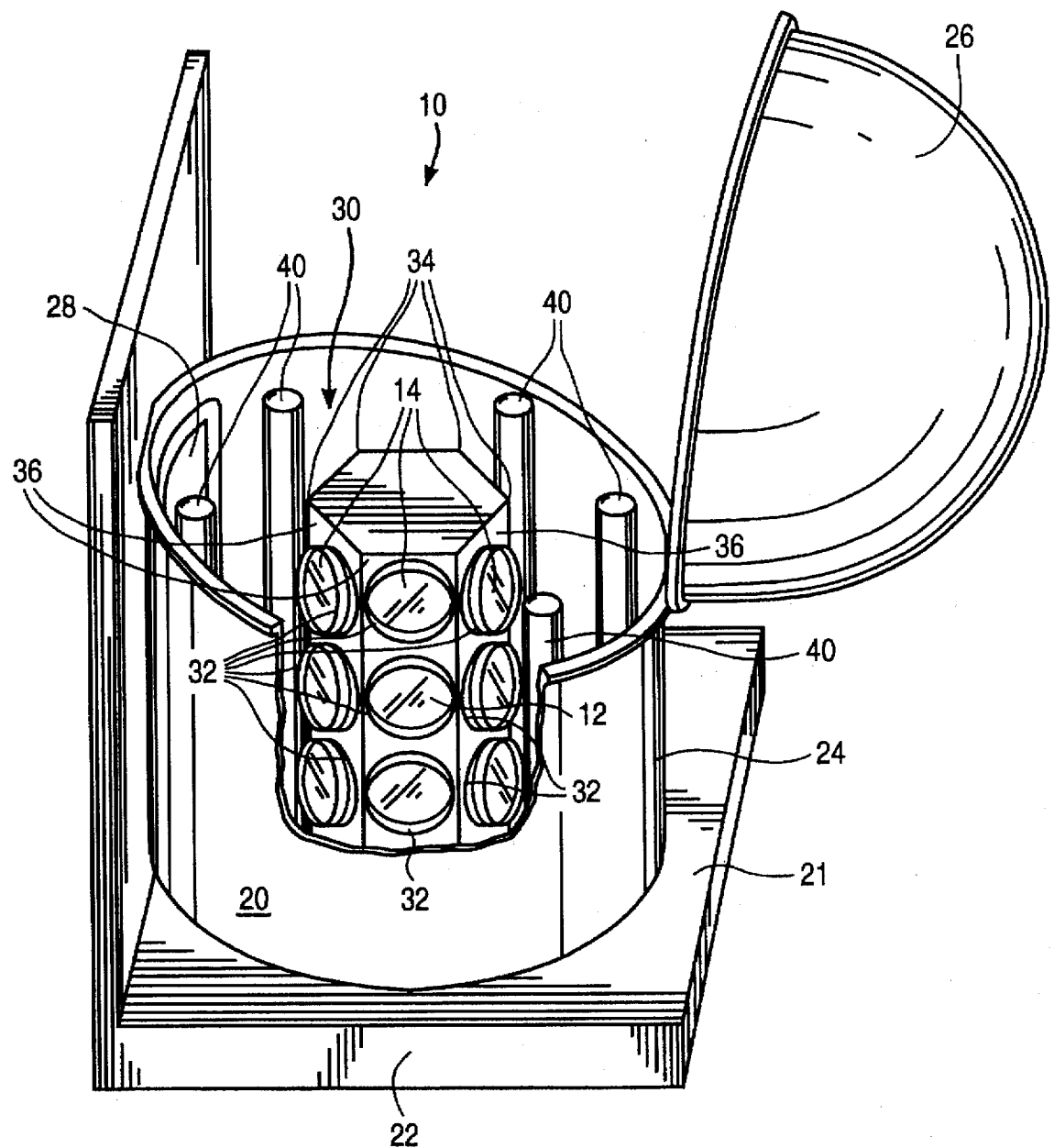
FIG. 1 is a perspective view of an etch chamber, with the cover in the open position.
Figure 2:
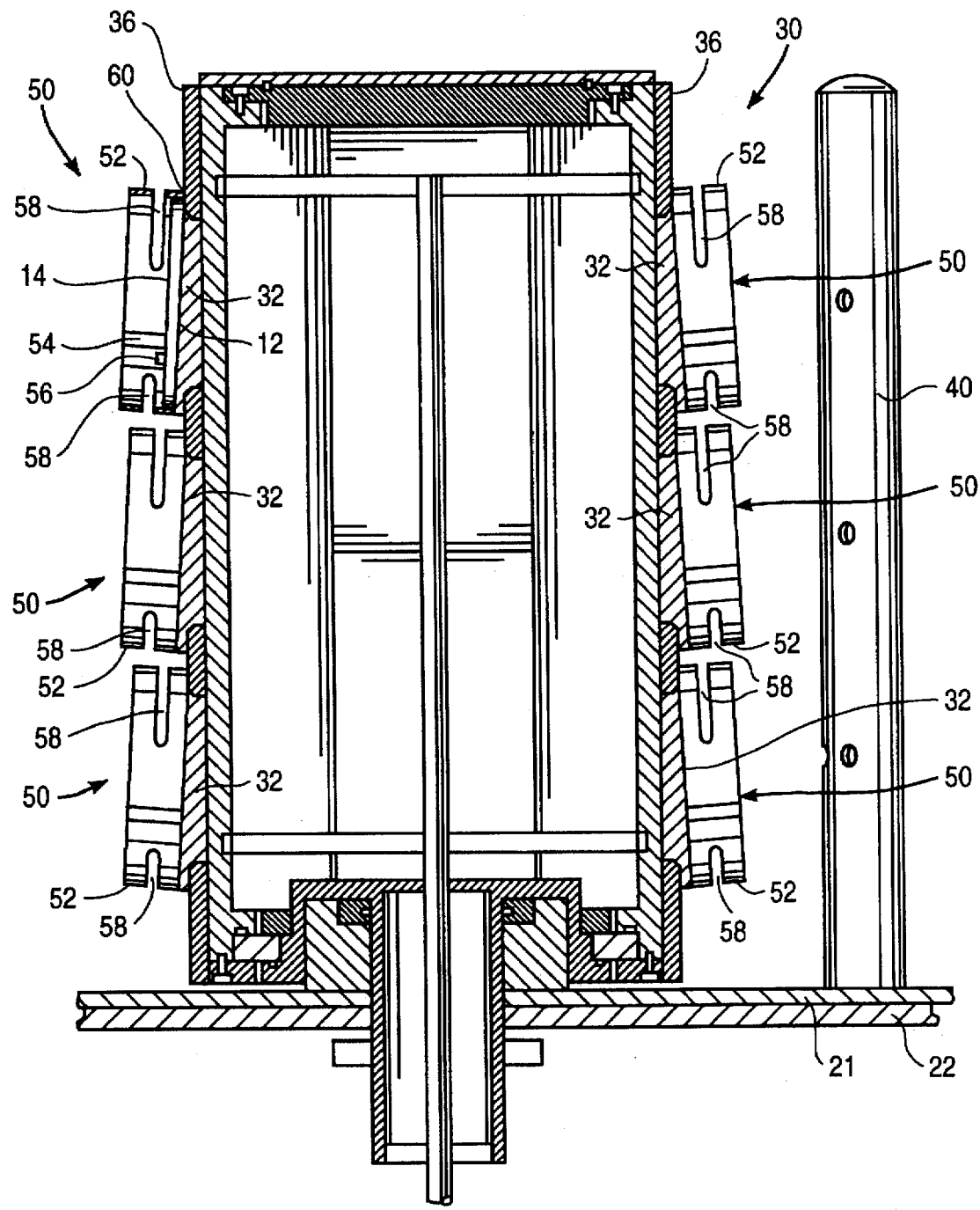
FIG. 2 is a sectional view of the multi-sided cathode of FIG. 1 showing the relationship of one gas tube to the cathode, with one of the focus rings thereon shown in section.
Figure 5:
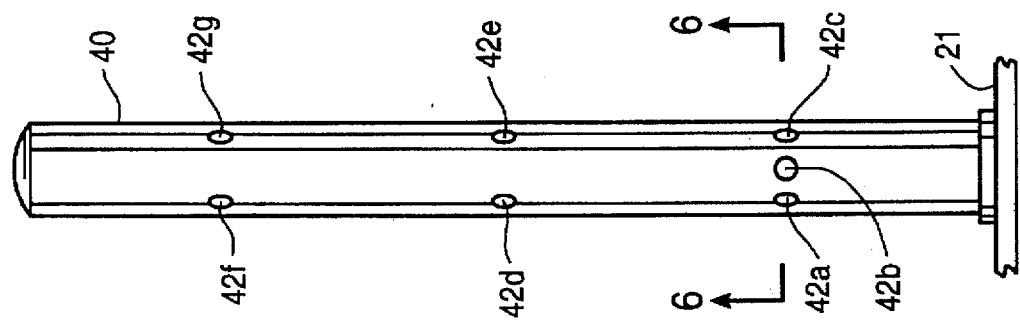
FIG. 5 is a view of the gas tube of FIG. 3 viewed from the perspective denoted at section 5—5.
Figure 4:
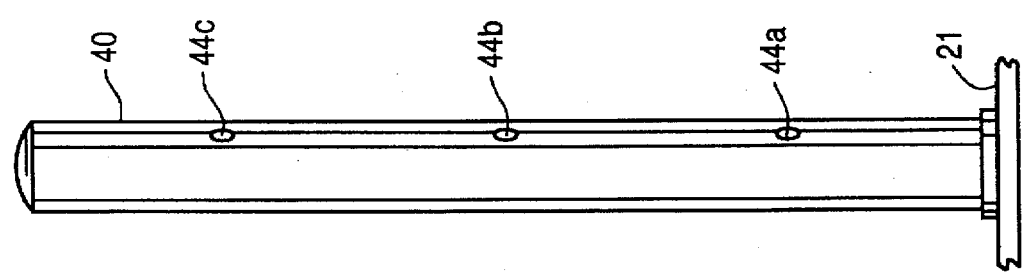
FIG. 4 is a view of the gas tube of FIG. 3 viewed from the perspective denoted at section 4—4.
Figure 3:
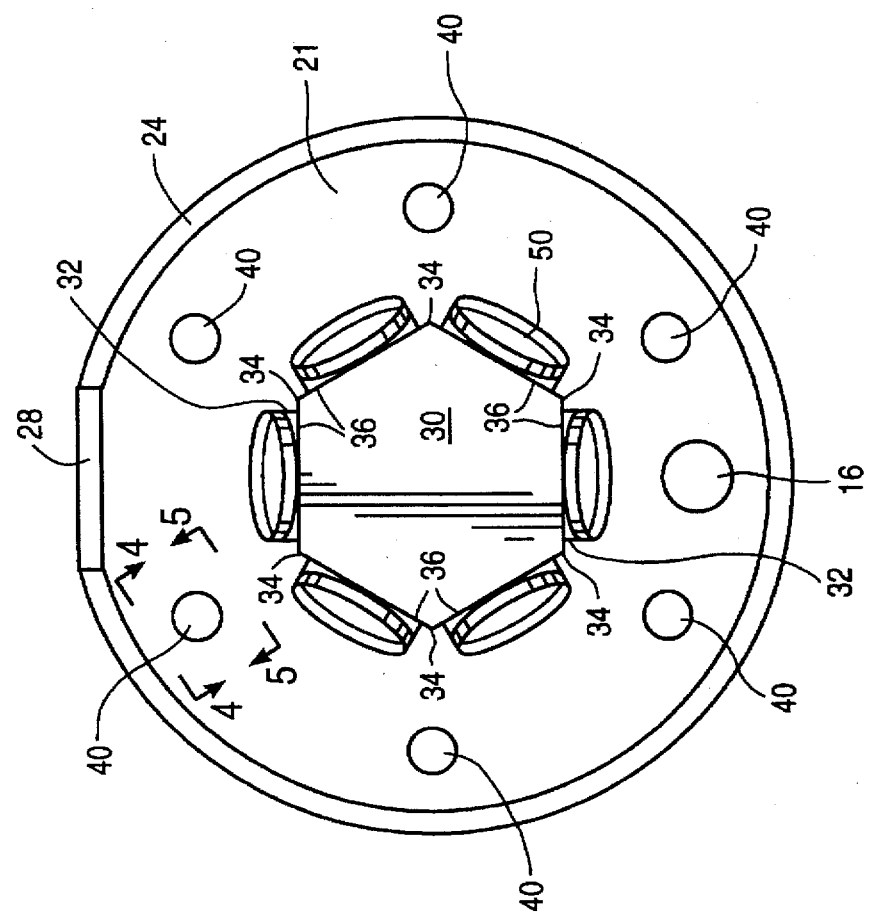
FIG. 3 is a top view of the chamber of FIG. 1, with the cover thereof removed.

Referring generally to FIGS. 1 through 3, the present invention is described for use in an etch chamber 10 for simultaneously etching a plurality of substrates 12. Etch chamber 10 includes a generally right circular housing 20, which encloses an electrode configured as a six-sided cathode 30. Cathode 30 preferably includes six faces 36 which intersect at six apexes 34. A plurality of individual electrically conductive substrate pedestals 32 are disposed on each face 36 (best shown in FIGS. 1 and 2), and each pedestal 32 may receive a substrate 12 thereon for processing.

Housing 20 includes a generally right circular outer wall 24, a base 22 and a hemispherical cover 26, which provide an enclosure for maintaining a vacuum of approximately 5 to 200 milli-torr within the chamber 10. A process gas is charged into the vacuum, and an RF source is coupled to the cathode 30 to provide energy to convert the gas within chamber 10 into a plasma. A plurality of gas tubes 40 are provided about the periphery of cathode 30 to supply the process gas into the chamber, and a turbo-port 16 (shown in FIG. 3) is provided in the base 22 of housing 20 to exhaust spent gases from the chamber 10. Turbo-port 16 is preferably a throttled exhaust valve. Individual substrates 12 are placed onto the pedestals 32, and removed therefrom, by a robot with fingers (not shown) which enters the chamber through gate valve 28. Cathode 30 rotates within housing 20 to position the individual pedestals 32 in alignment with the gate valve 28 for receipt and removal of the substrates 12. To electrically isolate cathode 30 from housing 20, a two-piece quartz sub base 21 is disposed over base 22 within housing 20, and cathode 30 is received thereon.

Figure 6:
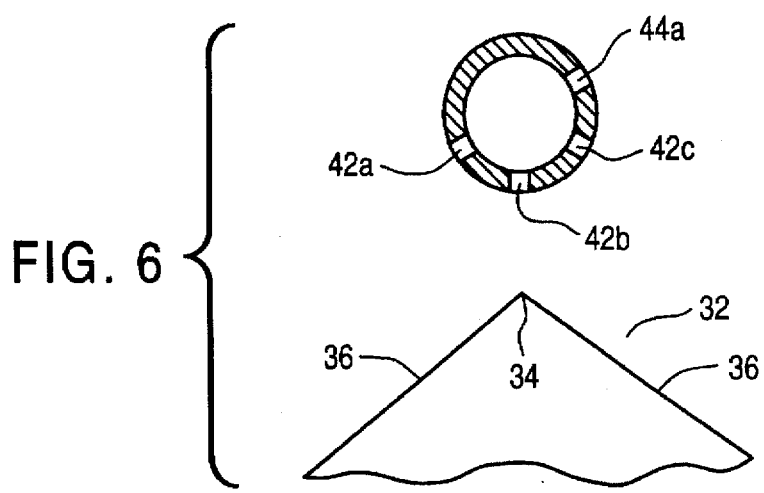
FIG. 6 is a sectional view of the gas tube of FIG. 5 at section 6—6, with the adjacent edge of the cathode shown for reference.

FIGS. 2 to 6 show the location of the gas tubes 40 about the cathode 30 in more detail, including the location of each tube 40 between each cathode apex 34 and the housing outer wall 24. A process gas line preferably supplies process gas to the interior of each adjacent pair of tubes 40. Tubes 40 are preferably manufactured from stainless steel for metal etching in chamber 10, and of aluminum for oxide etching in the chamber 10. Each tube 40 is provided with a plurality of holes 42 therein which direct process gas in the direction of the cathode 30 as in the prior art, and also includes a plurality of backside holes 44 (best shown in FIG. 4) therein to direct process gas obliquely against the inner face of wall 24. Holes 42 are provided through tube 40 at elevations generally corresponding to the height of substrates 12 on cathode 30. Three holes 42a, b, c are provided adjacent the lower portion of tube 40, two holes 42d, e, are provided near the middle of tube 40, and two holes 42f, g are provided adjacent the top of tube 40. As best shown in FIGS. 2 and 6, lower hole 42b is located to direct process gas directly at the adjacent apex 34 of cathode 30, and each of holes 42a, c are located to direct the process gas across the faces 36 of cathode 30 extending from the adjacent apex 34. Holes 42d, e and 42f, g are likewise located to direct process gas across the faces 36 of cathode 30 extending from the adjacent apex 34. Holes 42a, d, and f are vertically aligned, and holes 42c, e and g are vertically aligned. Back side holes 44 include lower hole 44a, middle hole 44b and upper hole 44c. Hole 44a is disposed 180 degrees from hole 42a, hole 44 b is disposed 180 degrees from hole 42d and hole 44c is disposed 180 degrees from hole 42f. The back side holes 44a–c in each of the plurality of gas tubes 40 are all similarly oriented with respect to the apexes 34 of cathode 30, to direct process gas obliquely against chamber wall 26 in the same rotational direction and therefore provide a constant supply of gas to create a rotational current of plasma about the inner surface of wall 24. The holes 44a–c may be located in tubes 40 to create a clockwise, or counterclockwise, flow along the inner surface of wall 24. In either case, all holes 44a–c should preferably be located with the same orientation to create a rotational flow along the inner surface of chamber wall 24. Plasma created from the gas exiting holes 44a–c is exhausted into turbo-port 16 as it passes around the inside of chamber wall 24, and thus a constant swirling supply of process gas, which is converted into a swirling-plasma, is provided to remove polymer as it builds adjacent the chamber wall 24, or to maintain conditions adjacent wall 24 which prevent the creation of polymer in the space between tubes 40 and wall 26. Holes 42, 44 are preferably 0.06 inches in diameter. It is contemplated that the total flux of gas flowing through each tube 40 need not be changed to compensate for the additional holes 44a–c, and thus a portion of the process gas that would previously have been directed at the cathode 30 and substrates 12 is directed at the wall 24. For $CL_2$ etch, the preferred total gas flow is 20–40 sccm, for $BCL_3$ etch the preferred total gas flow is 80–125 sccm, for $CF_4$ etch the preferred flow rate is 30 to 40 sccm and for $CHF_3$ etch the total flow rate is 50–80 sccm.

Figure 7:
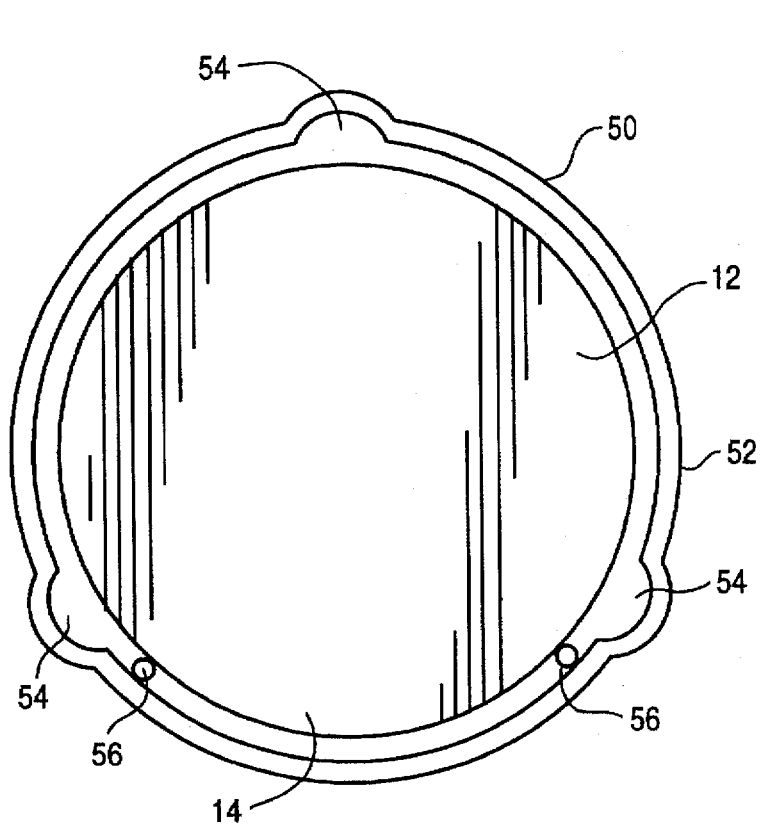
FIG. 7 is a view of a substrate and focus ring of FIG. 2 from the perspective normal to the substrate.

Referring now to FIGS. 2 and 7, the improved focus ting 50 of the present invention is shown. Focus rings 50 are located about the perimeter of each substrate 12, and each ting 50 includes a base 60 which is located over the outer circumference of the individual pedestals 32 on cathode 30 and secured thereto with screws or other attachment means.

Focus ring 50 includes a generally circular wall 52 extending outwardly from base 60 which includes three equally-spaced robot access extensions 54 therein (FIG. 7) which extend radially outwardly from wall 52 to provide clearance for the robot to reach to the base 60 of the focus ting 50 to insert and remove the substrate 12 located on pedestal 32 for processing. Two substrate support buttons 56 extend from cathode 30 adjacent the pedestal 32 within focus ting 50, to support substrate 12 about its edge within focus ting 50. Each pedestal 32 is disposed approximately 2° from vertical. Gravity maintains the substrate 12 against the individual pedestals 32, and buttons 56 center substrate 12 within the focus ting 50 to provide clearance between the edge of substrate 12 and extensions 54. Focus ring 50 and buttons 56 must be non-conductive members, and are preferably manufactured from high purity polycarbonate.

When a plasma is generated in a chamber, an electron depleted region forms within the chamber adjacent the cathode. This region is known as "the dark field." It has been found that polymer, and other substrate contaminants, will "float" at the edge of the dark field so long as the plasma energy field is maintained. When the RF power supply is de-energized, the plasma collapses into a loosely associated gas in the vacuum environment of the chamber, and allows the contaminants to attach to adjacent cathodic surfaces, including the substrate 12. Because prior art focus rings form a barrier against gas flow in the area adjacent the substrate, contaminants become trapped in the dark field within the focus ring and attach themselves to the substrate. The contaminants are primarily electrostatically attracted to the substrate 12, but they may also fall onto the substrate 12 under the influence of gravity. It has also been found that the location of the dark field may be moved with respect to the cathode by varying the chamber pressure, and thus it is believed that the contaminants therein may be moved away from the substrate 12 by varying the chamber pressure. The modified focus ring 50 of the present invention is used, in combination with this phenomenon, to reduce the incidence of particle contamination of the substrate 12.

The circular wall 52 of focus ring 50 is modified to include a plurality of plasma exchange apertures therethrough, preferably in the form of slots 58, which extend through the wail 52 generally parallel to focus ring base 60 (shown in FIG. 2). Slots 58 are preferably ⅛ inch high, and extend about the circumference of wall 52 at the distance from the substrate 12 at which the dark field typically appears for a given set of processing variables. Slots 58 allow gas and plasma flow therethrough, without substantially increasing the incidence of oblique electron bombardment on the substrate.

Slots 58 are used, in conjunction with variations in the process pressure and flow, to exhaust polymer out of the focus ring 50 as the RF source is turned off and the plasma collapses back into the process gas at the end of the process cycle. At a relatively constant temperature and process gas flow, a decrease in chamber pressure will cause the dark field, and particulate contaminants suspended therein, to move away from the cathode 30. This phenomenon is used, in conjunction with the slots 58, to pump the volume within focus ring 50 and thus flush polymer out of the focus ring 50 before the plasma collapses at the end of an etch processing cycle. According to the present invention, the chamber pressure is preferably maintained relatively constant throughout the cycle, until near the end of the processing cycle, typically the last five to ten seconds. At this point, prior to the de-energization of the RF field, the chamber pressure is rapidly decreased for the remainder of the cycle.

The pressure is decreased preferably by adjusting turbo-port 16 to increase the effective pumping therethrough, while maintaining a constant process gas flow. Alternatively, the gas flow may be decreased to reduce the chamber pressure. If the gas flow is used to alter the chamber pressure, the turbo port is preferably locked in position to create a fixed exhaust orifice. This pressure decrease accelerates the dark field, and any polymer therein, away from the substrate 12. Preferably, the chamber pressure is constantly decreased during the last few seconds of the cycle, to maintain movement of the dark field and polymer away from the substrate 12 until the RF source is de-energized. Thus, the dark field and the polymer are travelling away from the substrate 12 as the RF source is de-energized. The speed and distance of polymer travel may be adjusted by varying the rate, and extent, of the pressure decrease used to move the dark field away from the cathode 30 and substrate 12 during the last few seconds of processing. By accelerating the polymer away from the substrate as the RF field is de-energized, the polymer will have sufficient momentum in a direction away from the substrate 12, to overcome the electrostatic attractive force between the polymer and substrate which arises when the plasma collapses.

It is also contemplated that the chamber pressure may be increased, or increased and decreased, during the last 5 to 10 seconds of substrate 12 processing to flush polymer from the area within the focus ring adjacent the substrate. When the pressure is increased, the dark field compresses and moves toward the upper surface 14 of substrate 12, and plasma will flow into focus ring 50 through slots 58 to compensate for the compressed plasma moving downwardly in the focus ring 50, to create flow discontinuities which disturb the suspension of polymer in the dark field. It is believed that this flow into slots 58 will mix the dark field layer which is otherwise stagnantly maintained within focus ring 50, and thus will cause some of the polymer trapped in the focus ring to flow out through slots 58 upon subsequent reduction of the pressure. Likewise, it is believed that pumping of the slots 58, by adjusting the chamber pressure up and down, will disturb the suspension of polymer in the dark field to cause the polymer and other contaminants to flow out through slots 58, or out the open top of focus ring 50, where it can no longer contaminate the substrate 12. Additionally, although the pressure change has been described as preferably made during the final 5 to 10 seconds of processing, longer or shorter time periods are specifically contemplated. Further, the pressure may be changed periodically during processing to eject the polymer or other contaminants from the area adjacent the substrate and out turbo port 16.

Figure 8:
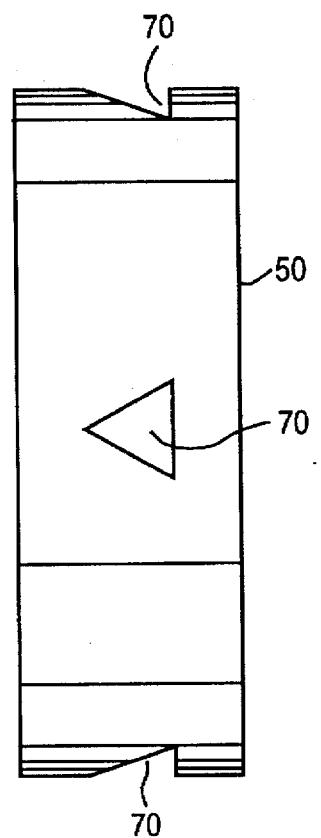
FIG. 8 is a side view of an alterative embodiment of the focus ring of FIG. 2.

FIG. 8 discloses one alternative embodiment of the focus ring 50, wherein the plasma exchange apertures are triangular holes 70, rather than slots 58. The plasma exchange apertures may be any shape and size which does not restrict the movement of plasma or process gas therethrough, but are sufficiently small to minimize oblique electron bombardment of the substrate 12, and also minimize flow eddies above the substrate 12 prior to pumping of the apertures during the final seconds of processing.

Although the focus ring 50 has been described in conjunction with a multi-sided cathode, the use of apertures through the body of the focus ring 50 to move polymer away from the substrate 12 surface may be used in conjunction with other apparatus, such as single-wafer etch chambers or other applications where the dark field occurs adjacent the substrate, without deviating from the scope of the invention. Likewise, the modification of the chamber pressure may be used in plasma etch and other plasma-processing environments, with or without a focus ring 50, to flush polymer from the area above or adjacent the substrate or other chamber surfaces, either during the processing cycle or as the processing cycle is completed. Additionally, pressure modification to move the dark field may be used to move particle contaminants other than polymer away from the substrate.

Figure 9:
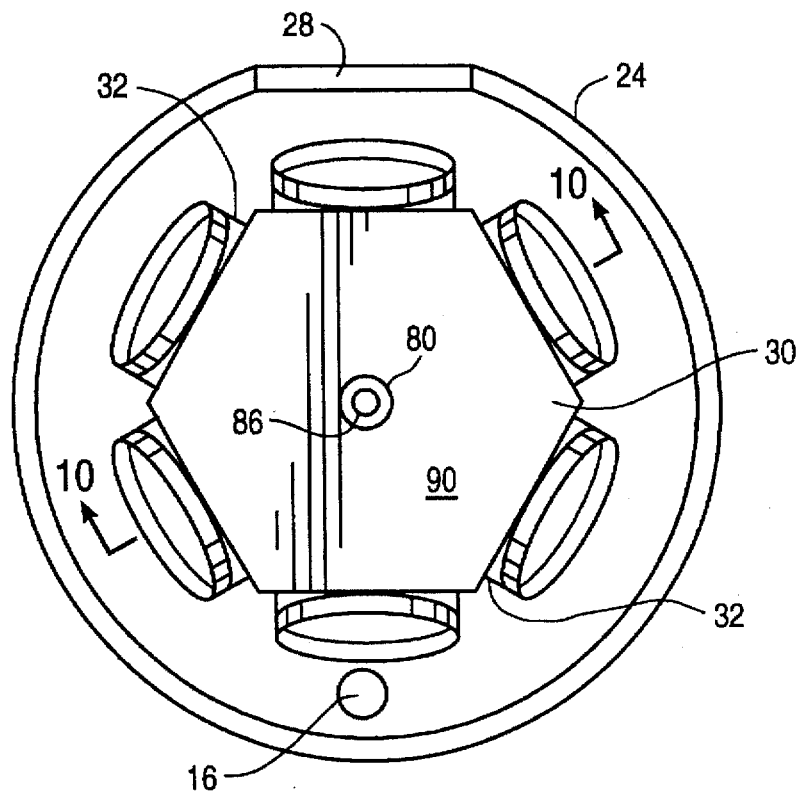
FIG. 9 is a top view of an alternative embodiment of the cathode of FIG. 2, including a diffuser head on the top of the multi-sided cathode.
Figure 10:
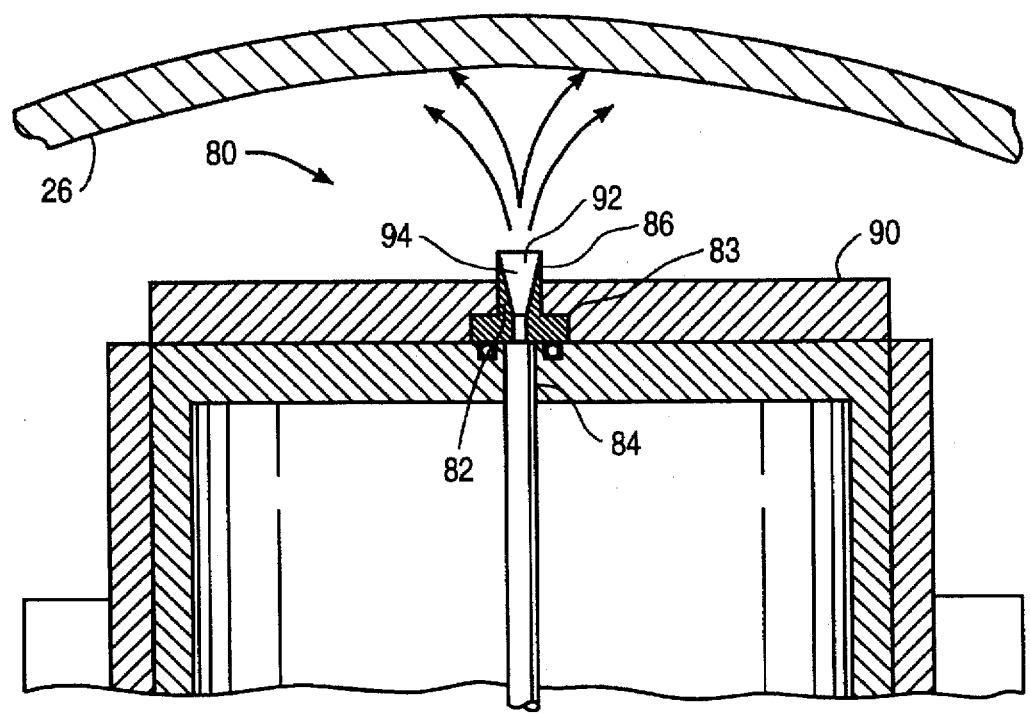
FIG. 10 is a partial sectional view of the chamber including the diffuser of FIG. 9 at section 10—10; and, FIG. 11 is a schematic view of the pneumatic control circuitry of the present invention.

Referring now to FIGS. 9 and 10, an additional apparatus for reducing polymer generation within the chamber 10 is shown. In this embodiment, a diffuser 80 is located on the top of cathode 30, and is supplied with a non-reactive purge gas, or a process gas, which is diffused out of the top of diffuser 80 along the inside of housing top 26 and down along wall 24. The gas is supplied through cathode 30 from a source outside of chamber 10. Diffuser 80 includes a stem 82 which is received over a port 84 in the top of cathode 30. Stem 82 includes an enlarged base 83 and an extending nozzle portion 86 therein. A cover 90 is received on the top of cathode 30 and includes a recess which aligns over enlarged base 83 to maintain diffuser 80 on cathode 40. Base 83 is received against a seal, such as an o-ring, on the top of cathode 30 adjacent port 84 which seals the diffuser 80 against the cathode 30 to ensure that the diffuser gas passes through nozzle portion 86. Nozzle portion 86 includes a bore 92 therethrough, which opens into an outwardly tapered portion 94 which creates a venturi as the gas exits the diffuser 80. The gas is dispersed from the diffuser 80, along the inside of top 26, and then down along the side 24 of housing 20, where it exits chamber 10 through turbo-port 16. The gas helps prevent polymer formation along the top 26 and side 24 of the housing, and helps flush away any polymer or other contaminants away from the top 26 and side 24 of the housing, to reduce the presence of polymer or other contaminants that can create a substrate 12 defect.

Figure 11:
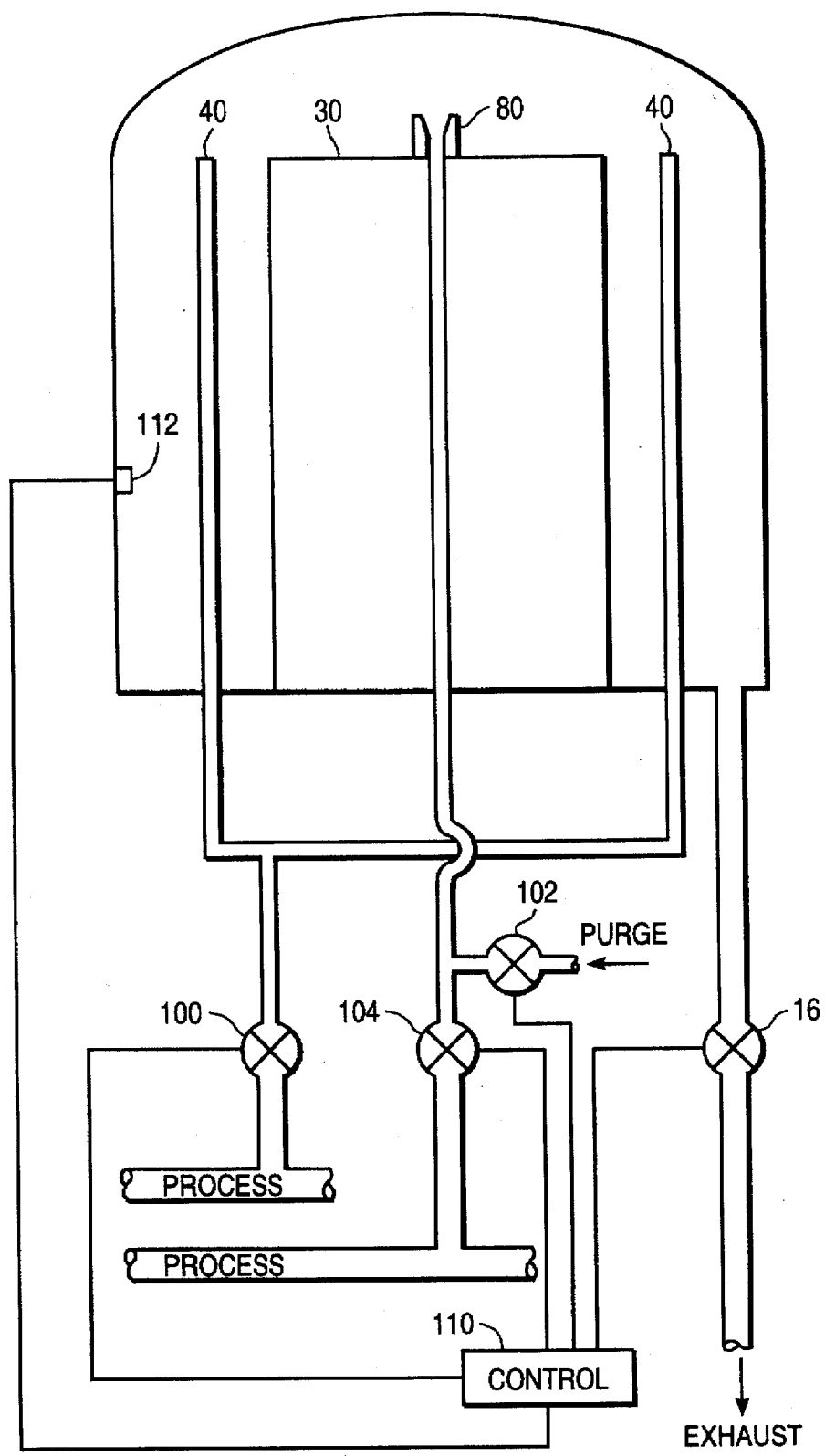

Referring now to FIG. 11, a schematic of the pneumatic control system is shown in conjunction with chamber 10. A controller 110, such as a Motorola 6800 CPU microprocessor, is linked by a plurality of control cables to turbo port 16, tube supply valve 100 which controls the supply of process gas to the gas tubes 40 (only 2 shown), and to purge valve 102 and process valve 104 which control the gas supply to diffusor 80. Process valve 104 and tube supply valve 100 are separately connected to a supply of process gas, and thus the passage of a process gas through diffusor 80 will not affect the process gas volume passing through the tube gas valve 100 and tubes 40. Additionally, purge valve 102 is provided to control the flow of purge gas into diffusor 80.

During processing, controller 110 controls the positioning of turbo port 16 and valves 100–104 to control the process environment. The primary processing parameters are pressure and gas density. With a given gas flow, and chamber pressure, the density is calculable. Therefore, the controller 110 maintains the gas valve 100 in a specified position to maintain the desired flow rate, while monitoring the chamber pressure through pressure sensor 112. Controller maintains the desired chamber pressure by adjusting turbo port 16 to adjust the flow of gas out of the chamber and to a vacuum sink.

To move the dark field and thus flush away contaminants from the substrate surface, controller 110 preferably maintains a steady flow of process gas through gas valve 100 and opens turbo port 16 to increase the flow rate therethrough and decrease the chamber pressure. Alternatively, the turbo port may be adjusted to decrease the flow rate therethrough and thus increase the chamber pressure. In a less preferred embodiment, the flow of process gas through valve 100 may be modified to change the chamber pressure. In that case, the turbo port 16 may also be locked in position, so that controller 110 does not adjust the turbo port 16 to maintain a constant chamber pressure.

Although the embodiments of the present invention have been described in terms of a plasma etch chamber having a specific cathode geometry, the use of other cathode geometries such as pentodes, i.e., five-sided cathodes, or other cathode configurations, is specifically contemplated. Additionally, the geometry of the apertures in the focus ring 50 may be varied without deviating from the scope of the invention, and the use of pumping apertures, the diffuser 80 and the back side holes 44a–c may be used concurrently, or independently, without deviating from the scope of the invention.

We claim:

1. A method of transporting contaminants away from a substrate in a processing chamber, the method comprising:
   evacuating the chamber;
   introducing a process gas into the chamber;
   establishing an electric field in the chamber to maintain the process gas as a plasma;
   placing an apertured non-conductive focus ring in the chamber;
   processing the substrate within the focus ring in the chamber; and
   changing the pressure in the chamber during substrate processing therein to move contaminants away from the surface of the substrate.

2. The method of claim 1, including the further steps of:
   maintaining the chamber at a first pressure during substrate processing; and
   changing the chamber pressure to a second pressure before de-energizing the electric field which maintains the plasma.

3. The method of claim 2, wherein the processing chamber is an etch chamber.

4. The method of claim 3, wherein the step of changing the chamber pressure is performed no more than ten seconds before the electric field is de-energized.

5. The method of claim 1, wherein the step of changing the pressure in the chamber includes the steps of:
   establishing a first pressure in the chamber and processing the substrate at the first pressure; and
   constantly reducing the pressure in the chamber during a time period, the electric field being de-energized at the end of the time period.

6. The method of claim 5, wherein the chamber is a plasma etch chamber.

7. The method of claim 6, further including the step of locating apertures of the focus ring only at a location from the substrate at which a dark field is established during substrate etching.

8. The method of claim 7, wherein the pressure in the chamber is decreasing as the plasma collapses.

9. The method of claim 8, wherein said apertures are longitudinal slots.

10. The method of claim 9, wherein said slots are one-eighth inch wide.

11. The method of claim 8, wherein said apertures are triangular.

12. The method of claim 1, wherein the chamber pressure is increased and decreased to move polymer away from the surface of the substrate.

13. The method of claim 12, wherein the pressure is changed within the last ten seconds of the precess cycle.

14. The method of claim 1, wherein the step of changing the pressure in the chamber includes the step of:

periodically changing the pressure in the chamber.

15. The method of claim 1, wherein the step of changing the pressure in the chamber includes the steps of:

(a) increasing the pressure in the chamber;

(b) after step (a), decreasing the pressure in the chamber.

16. A method of reducing the formation of contaminants in a plasma etch chamber during plasma etch operations, the chamber including a sealable housing having an outer wall and a cover which form an anode, the outer wall and the cover each having an inner surface, a cathode received in the sealable housing and including at least one pedestal located on a face thereof for receiving substrates for etching in the chamber, and a diffuser disposed on top of the cathode, the method comprising the steps of:

providing a process gas to form a plasma within the chamber; and using the diffuser to direct a second gas against the inner surface of the cover, and to thereby prevent the formation of polymer on the inner surfaces of the outer wall and cover and to flush contaminants away from the inner surfaces of the outer wall and cover during the etching of the substrates.

17. The method of claim 16, wherein the second gas is a non-reactive gas.

18. The method of claim 16, wherein the second gas is a reactive process gas.

19. The method of claim 16, wherein the diffuser contains an outwardly tapered portion for creating a venturi as the second gas received through the cathode exits the diffuser.

20. A method of reducing the formation of contaminants in a plasma etch chamber during plasma etch operations, the chamber including a chamber wall having an inner surface, a structure having one or more faces including a particular face on which a substrate to be etched is placed and a gas tube for delivering a process gas into the chamber, the gas tube having first and second sets of apertures, the method comprising the steps of:

directing a first portion of the process gas toward the structure through the first set of apertures, the first set of apertures including one or more apertures for directing the process gas across the particular face of the structure; and directing substantially the entire remaining portion of gas flowing in the tube through the second set of apertures against the inner surface of the chamber wall, wherein the apertures in the second set are disposed approximately 180 degrees from the one or more apertures for directing the process gas across the particular face of the structure.

21. A method of reducing the formation of contaminants in a plasma etch chamber during plasma etch operations, the chamber including a chamber wall having an inner surface, and a plurality of gas tubes for delivering a process gas into the chamber, each of the gas tubes having a respective aperture, the method comprising the step of:

directing the process gas through the apertures, wherein each of the apertures are at the same vertical height and positioned so as to direct the process gas in the same rotational direction obliquely against the inner surface of the chamber wall, thereby creating a rotational current of plasma about the inner surface of the chamber wall at the vertical height during an etching operation of said substrates.

22. A method of reducing the formation of contaminants in a plasma etch chamber during plasma etch operations, the chamber including a chamber wall having an inner surface, a structure having a face on which a substrate to be etched is placed and a gas tube for delivering a process gas into the chamber, the gas tube being located between the structure and the inner surface of the wall, the gas tube having first and second sets of apertures, the method comprising the steps of:

directing a first portion of the process gas toward the structure through the first set of apertures, the first set of apertures including one more apertures for directing the process gas across the face of the structure; and directing substantially the entire remaining portion of gas flowing in the tube through the second set of apertures at an acute angle to a plane that extends from the gas tube to the inner surface of the chamber wall and intersects the inner surface of the chamber wall at a right angle.

23. A method of transporting contaminants away from a substrate in a processing system, the processing system including a processing chamber that is in communication with a gas supply and an exhaust and a pressure controller that can be programmed to change the pressure in the processing chamber at one or more specific moments during an etch process, the method comprising:

evacuating the chamber;

introducing a process gas into the chamber;

establishing an electric field in the chamber to maintain the process gas as a plasma;

etching the substrate in the chamber;

reducing the chamber pressure at a first specific moment prior to turning off the electric field and towards the completion of a substrate operation; and increasing the chamber pressure at a second specific moment prior to the first specific moment.

24. The method of claim 23, wherein the steps of increasing and decreasing the pressure are performed by adjusting the exhaust.

25. The method of claim 23, wherein the steps of increasing and decreasing the pressure are performed by adjusting the gas supply.

26. The method of claim 23, wherein the processing system further includes a gas tube received in the chamber and supplied with gas from the gas supply and having an aperture, further comprising:

directing gas through the aperture against an inner wall of said chamber.

27. The method of claim 23, wherein said pressure controller includes a microprocessor controller.

28. The method of claim 23, wherein the processing system further includes a process gas supply and a gas tube, the gas tube being received in the chamber and supplied with process gas from the process gas supply and having an aperture, further comprising:

directing process gas through the aperture against an inner wall of said chamber.

29. The method of claim 23, wherein the second specific moment occurs between five and ten seconds before the completion of the substrate operation.

30. The method of claim 23, further comprising:

increasing and then decreasing the pressure in the chamber periodically during the substrate operation.

* * * * *